(12) United States Patent
Laermer et al.

(10) Patent No.: US 6,531,068 B2
(45) Date of Patent: Mar. 11, 2003

(54) METHOD OF ANISOTROPIC ETCHING OF SILICON

(75) Inventors: Franz Laermer, Stuttgart; Andrea Schilp, Schwaebisch Gmuend, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/328,019

(22) Filed: Jun. 8, 1999

(65) Prior Publication Data

US 2002/0144974 A1 Oct. 10, 2002

(30) Foreign Application Priority Data

Jun. 12, 1998 (DE) .......................................... 198 26 382

(51) Int. Cl.[7] ............................................ H01L 21/308
(52) U.S. Cl. .............................. 216/37; 216/41; 216/67; 216/79; 438/695; 438/696; 438/729; 438/733
(58) Field of Search ............................... 216/41, 46, 67, 216/79, 71, 2, 37; 438/695, 696, 726, 733, 729

(56) References Cited

U.S. PATENT DOCUMENTS

| | | | | |
|---|---|---|---|---|
| 5,498,312 A | * | 3/1996 | Laermer et al. ............... | 216/37 |
| 5,575,887 A | * | 11/1996 | Yoshida et al. ........... | 156/643.1 |
| 5,767,017 A | * | 6/1998 | Armacost et al. ........... | 438/694 |
| 5,767,018 A | * | 6/1998 | Bell ............................ | 438/696 |
| 5,798,303 A | * | 8/1998 | Clampitt ...................... | 438/696 |
| 5,858,847 A | * | 1/1999 | Zhou et al. .................. | 438/305 |
| 5,882,535 A | * | 3/1999 | Stocks et al. .................. | 216/18 |
| 5,935,874 A | * | 8/1999 | Kennard ...................... | 438/710 |
| 5,948,701 A | * | 9/1999 | Chooi et al. ................. | 438/694 |
| 5,980,769 A | * | 11/1999 | Yanagisawa et al. ......... | 216/67 |
| 5,983,828 A | * | 11/1999 | Savas .......................... | 118/723 |
| 5,994,232 A | * | 11/1999 | Clampitt ...................... | 438/706 |
| 6,069,091 A | * | 5/2000 | Chang et al. ................ | 438/719 |
| 6,087,270 A | * | 7/2000 | Reinberg et al. ............. | 438/736 |

FOREIGN PATENT DOCUMENTS

DE 42 41 045 5/1994

\* cited by examiner

Primary Examiner—Randy Gulakowski
Assistant Examiner—Jiri Smetana
(74) Attorney, Agent, or Firm—Kenyon & Kenyon

(57) ABSTRACT

A method of anisotropic etching of silicon with structures, preferably defined with an etching mask, by using a plasma, with a polymer being applied during a polymerization step to the lateral border of the structures defined by the etching mask, then being partially removed again during the following etching step and being redeposited in deeper side walls of the structure newly formed due to the etching reaction, and the etching is performed with an etching gas containing 3 to 40 vol % oxygen. In this way it is possible to prevent sulfur contamination in the exhaust gas area in high rate etching of silicon.

18 Claims, 1 Drawing Sheet

METHOD OF ANISOTROPIC ETCHING OF SILICON

BACKGROUND INFORMATION

German Patent No. 42 41 045 describes a method of anisotropic etching of silicon in structures preferably defined with an etching mask, in particular recesses with a precise lateral extent in silicon by using a plasma, with the anisotropic etching operation being carried out separately in alternating separate etching and polymerization steps which are controlled independently of one another, and with a polymer being applied to the lateral border of the structures defined by the etching mask during the polymerization step, being removed again partially during the following etching step and then being redeposited in the deeper parts of the side wall newly formed by the etching reaction, thereby producing local edge protection and local anisotropy.

Sulfur hexafluoride $SF_6$ is used preferably as a gaseous etchant supplying fluorine in alternation with a passivation gas of trifluoromethane $CHF_3$, which forms Teflon®-like polymers, in a high density plasma, e.g., with inductive excitation (ICP=inductively coupled plasma) or with microwave excitation (PIE=propagation ion etching), to etch silicon anisotropically at very high rates. High-rate etching is understood to refer to rates of 5 $\mu$m/min, for example.

At the same time, a very high selectivity with respect to the photoresist mask layer, for example, can be achieved here. During the deposition steps, a side wall polymer is deposited on the side walls of etched structures. During the etching steps, etching is continued essentially isotropically in the silicon, resulting in effective protection of the newly exposed side walls locally during continued etching due to removal and redeposition of the side wall polymer material into deeper portions of the etching pit. Due to this entrainment of the side wall polymer toward deeper portions of the etching pit during continued etching, a local anisotropy of the essentially isotropic (because it is based on fluorine) etching process is achieved. Removal and redeposition are then achieved by the portion of ions accelerated toward a wafer, for example, due to the bias voltage applied during the etching cycles during the etching step, but not striking it exactly perpendicularly and therefore not striking the etching base directly but instead striking the side walls of the structure, pushing the side wall polymer deeper there. This portion of ions not striking exactly perpendicularly must therefore be optimized for the process management, and the ion energy must also be selected on the basis of the high frequency power responsible for the bias voltage of the substrates to the plasma so that a perpendicular wall profile with minimal wall roughness is achieved.

In a preferred embodiment of the method described in German Patent No. 42 41 045, for example, a pressure of 13.3 $\mu$bar is selected for the deposition cycle and a pressure of 26.6/$\mu$bar is selected for the etching cycle. To adjust the pressures in accordance with these specifications, for example, a slow pressure regulator may be set at a setpoint pressure of 19.95 $\mu$bar. Because of the different effective gas flow rates during the deposition and etching cycles, a pressure of approximately 13.3 $\mu$bar is then achieved automatically in the deposition step. The deposition process is the most efficient at this pressure. A pressure of approximately 26.6/$\mu$bar is automatically achieved in the etching step, which is a favorable value for the etching step. A fast pressure regulator with two independent setpoint settings may also be used to make it possible to set the deposition step pressure and the etching step pressure at the selected values.

However, the following problem occurs with this known method. The reaction releasing the fluorine radicals necessary for the etching step is the decomposition of $SF_6$ into $SF_4$ according to the following equation:

$$SF_6 \rightleftharpoons SF_4 + 2F$$

Since the equilibrium of this reaction is on the side of the free fluorine radicals under the reaction conditions, a large quantity of these radicals are available. Therefore, even at a very high excitation density in the plasma, with several times 10% of the $SF_6$ feedstock being converted in the manner described here, additives which inhibit the reverse reaction are unnecessary. However, a relatively small amount of the $SF_6$ is converted beyond $SF_4$ to sulfur fluoride compounds with an even lower fluorine content or even to sulfur atoms.

For the etching process described here, the occurrence of sulfur is of no relevance because deposition of sulfur cannot occur on the wafer surface or in the process chamber at the stated process pressures at a substrate temperature of 30° C. or even at lower substrate temperatures of −30° C., for example. However, sulfur deposits which have an extremely negative effect are formed in particular on unheated walls in the area of the vacuum pumps, in particular turbomolecular pumps, and in the exhaust gas line of the turbo pumps, where the gas pressure is increased from the process pressure to the back pressure of the turbo pump. Formation of sulfur is based on the usual reaction of sulfur atoms to form the known sulfurous ring molecules, in particular $S_8$. This contamination of the exhaust gas lines and parts of the turbo pump with sulfur deposits can lead to failure of the turbo pump in the medium-term, but it also entails the risk that larger quantities of loose sulfur dust might be entrained inadvertently into the process chamber when the vacuum pumps are turned off or if they fail, for example.

SUMMARY OF THE INVENTION

Figure 1:
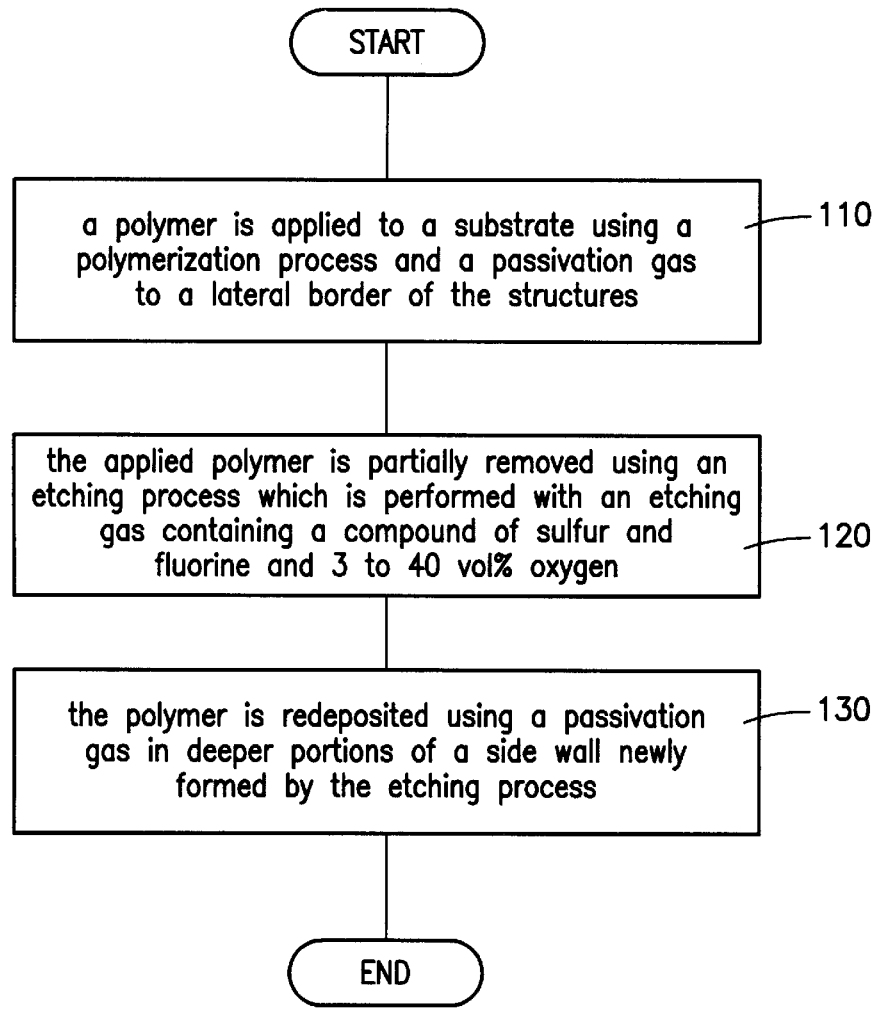
FIG. 1 depicts one embodiment according to the present invention.

Therefore, an object of the present invention is to provide a method in which sulfur contamination in the exhaust gas area can be prevented in anisotropic etching of silicon.

According to the present invention, this object is achieved by a method of anisotropic etching of silicon by structures, preferably defined with an etching mask, by using a plasma, with a polymer being applied during a polymerization step to the lateral border of the structures defined by the etching mask, the polymer being partially removed again during the following etching step and being redeposited on the newly formed side walls at a deeper location, the etching being performed with an etching gas containing 3 to 40 vol % oxygen.

The success of this method is surprising in particular because the addition of oxygen has practically no effect at all on the actual etching process.

A special advantage of the method according to the present invention is first that the lifetime of the turbo pumps is greatly prolonged and second that sulfur contamination of the process chamber due to inadvertent entrainment of sulfur dust from the exhaust gas area is prevented.

According to the present invention, these disadvantages of the known etching process which have caused major problems in the past are now eliminated completely in a simple manner.

In a preferred embodiment, the oxygen content is 5 to 25 vol % during the entire duration of the etching step; in an especially preferred embodiment, the oxygen content is 10 to 15 vol % during the entire duration of the etching step.

The quantity of oxygen added can be kept small because only a small portion of the $SF_6$ molecules decomposes to sulfur atoms. Furthermore, $SF_6$ and $SF_4$ will hardly react with oxygen under the etching conditions, so the loss of oxygen due to reactions with these molecules remains negligible. This is also one reason why adding oxygen in the etching process does not result in any increase in the concentration of free fluorine radicals, which is known to be the case with a $CF_4$ plasma, for example.

At the low pressure prevailing in the process chamber, only a few sulfur atoms are captured by oxidation reactions. This is of no relevance because the sulfur atoms also do not cause any interference there.

According to the present invention, however, oxidation of sulfur atoms to volatile SO or $SO_2$ occurs now instead of the molecule forming reaction to form the known sulfur rings during compression of the exhaust gas in the turbomolecular pump or in the turbo pump and in the exhaust gas lines. As a side reaction, volatile sulfur fluorides and sulfur oxyfluorides are also formed. Therefore, there is no longer any interfering deposition of sulfur, and the turbo pumps or the turbomolecular pumps and the exhaust gas lines remain advantageously free of sulfur dust.

It is important with the process according to the present invention that the quantity of oxygen supplied during the etching process remains relatively low and thus the concentration of oxygen atom radicals in the plasma is low, so they cannot have any negative influence on the total etching process.

For example, the removal of resist mask from wafers is not to be increased, i.e., one goal is for the very high, advantageous resist mask selectivity of the etching process of >100:1, e.g., 100–200:1, to be maintained. Furthermore, the side wall film transport mechanism which is responsible for the development of smooth side walls is also to be maintained. The side wall polymer should thus be sputtered forward essentially into the depth of the etching pits and should not be converted by oxidation to compounds no longer capable of redeposition. The concentration of oxygen atom radicals formed which can irreversibly convert the photoresist of the resist mask or the side wall polymer must thus remain low in comparison with the ion supporting erosion by fluorine radicals, which permits subsequent redeposition.

Furthermore, the formation of silicon oxides from the reaction of silicon fluorides, the reaction product of silicon etching by fluorine, with oxygen atom radicals is unwanted in the etching process, because this can result in redeposition of silicon dioxide on the wafer surface. Silicon-oxygen compounds are very stable chemically and therefore are no longer degraded completely at the low ion energies of the anisotropic etching process, so that micromasking can occur on the etching ground. Silicon dioxide in particular is responsible for this. This micromasking can lead to the formation of needles, spikes, microroughness or even black silicon. Because of the process parameters which have been optimized for the high mask selectivity, the process management does not allow any reliable removal of silicon dioxide deposits because the ion energy is not sufficient for this. The selectivity of the process with respect to $SiO_2$ is >200:1, e.g., 200–300:1, which makes $SiO_2$ a very resistant mask.

Adding oxygen gas in the quantity ranges claimed yields practically none of the negative effects described above, i.e., the process properties are practically unchanged and the etching rates, the selectivity and the side wall profile are preserved, as shown by a corresponding process without the addition of oxygen according to the present invention. Thus, for example, at a gas flow rate of 20 sccm $O_2$=20 $cm^3$[STP]/min, $O_2$ substrates such as 6" silicon wafers can be thinned over the entire surface for several hours without resulting in the development of needles, spikes or black silicon. The oxygen concentrations are neutral with respect to the resist mask selectivity, the etching rates and the side wall roughness. On the other hand, the concentrations indicated are completely sufficient to prevent sulfur deposits in the exhaust gas area and in the pumps.

The oxygen flow can remain switched on during the entire duration of the etching steps. However, it is also possible according to the present invention to add the oxygen only during short intervals of preferably 0.1 to 1 sec within each etching step. Furthermore, it is possible to add the etching gas containing oxygen only at the beginning and/or end of an etching step.

Due to this embodiment according to the present invention, the etching step remains free of added oxygen for most of the time and it is influenced only relatively briefly. However, it should be pointed out here that the $O_2$ gas flow must be so high that definitely no deposition of sulfur is possible in the exhaust gas area.

Gas flow rates of 10–200 $cm^3$[STP]/min and process pressures of 5 to 100 $\mu$bar are preferably selected for the media used in the etching steps and the polymerization steps. The plasma is preferably generated with a microwave radiation at powers between 100 and 1500 W or with a high frequency radiation at powers between 100 and 2000 W in an inductively coupled plasma source.

The passivation gases forming Teflon®-like polymers may be trifluoromethane $CHF_3$, hexafluoropropene $C_3F_6$ or octafluorocyclobutane $C_4F_8$. Hexafluoropropene $C_3F_6$ and in particular octafluorocyclobutane $C_4F_8$ are suitable especially when using a plasma with inductive excitation (ICP) because such ICP sources have a lower chemical activity than the microwave source on which German Patent No. 42 41 045 is based and therefore gases more willing to undergo passivation are needed.

It is important for the oxygen to be added only during the etching steps and not during the deposition steps. Oxygen in the deposition step would massively impair the formation of Teflon®-like polymers on the structure side walls, because the radicals $\dot{C}F_2$ or $\cdot(CF_2)_n\cdot$ which form Teflon® by nature have a very high affinity for oxygen molecules. This would cause the polymerization of the Teflon®-forming radicals to come to a standstill, so that side wall protection would no longer be achieved in the usual way and the deposition step would become inefficient.

Referring to FIG. 1, which depicts a flow chart of an embodiment of the method according to the present invention of anisotropic etching of silicon with structures by using a plasma, in step 110, a polymer is applied to a substrate using a polymerization process and a passivation gas to a lateral border of the structures. In step 120, the applied polymer is partially removed using an etching process which is performed with an etching gas containing a compound of sulfur and fluorine and 3 to 40 vol % oxygen. In step 130, the polymer is redeposited using a passivation gas in deeper portions of a side wall newly formed by the etching process.

Figure 2:
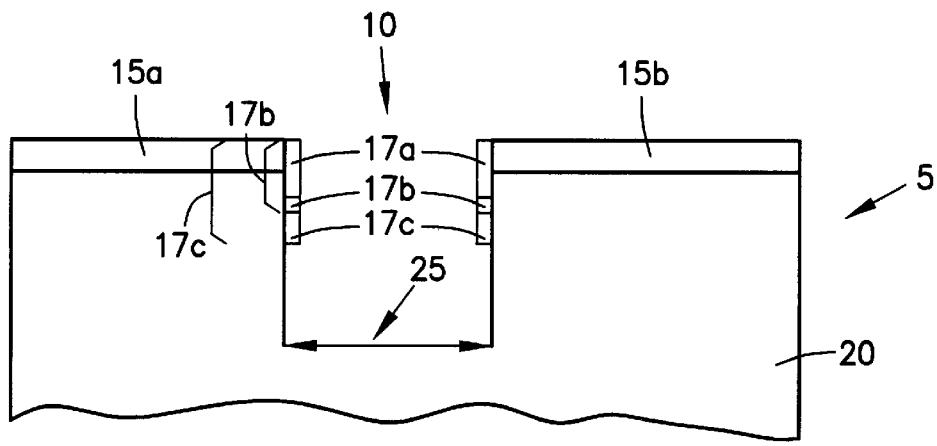
FIG. 2 depicts a cross-section of a silicon wafer made according to the present invention.

FIG. 2 depicts a cross-section of a silicon wafer including a partially-formed anisotropic etch made according to the present invention. The wafer includes (at least) a top photomask layer 15a, 15b, and a silicon layer 20. The photomask layer is divided into portions 15a, 15b separated horizontally. In the space between the photomask layer portions 15a, 15b, a plasma creates an etch 10 by removing portions of the silicon layer 20. As etching is performed, a polymer layer, e.g., 17a, is deposited on the side wall of the etch 10. The polymer layer provides a measure of protection to the side wall of the etch 10 during subsequent etching steps and thereby both preserves a constant etch width 25 and provides for a predominantly vertical etch. In the subsequent etching steps, as the etch 10 deepens, the polymer layer is removed and redeposited to increasingly greater depths in etch 10 as successively deeper layers 17b, 17c.

The parameter set for one embodiment is given below.
1. Deposition cycles
    Pressure: 13.3 μbar
    Gas flow: 100 sccm $C_4F_8$
    Power of the high density plasma source: 600–2000 W, e.g., 800 W (13.56 MHZ for ICP or 2.45 GHz for PIE)
    Bias voltage power: 0 W
    Duration of step: 5 sec
2. Etching cycles
    Pressure: 26.6 μbar
    Gas flow: 130 sccm $SF_6$+20 sccm $O_2$
    Power of the high density plasma source: 600–2000 W, e.g., 800 W (13.56 MHZ for ICP or 2.45 GHz for PIE)
    Bias voltage power: 7 W
    Duration of step: 9 sec
    Substrate temperature: +30° C.

What is claimed is:

1. A method of anisotropic etching of silicon with structures by using a plasma, comprising the steps of:
    a) applying a polymer, using a polymerization process and an oxygen-free passivation gas, to a lateral border of the structures;
    b) simultaneously:
        partially removing the applied polymer using an etching process, the etching process being performed with an etching gas containing sulfur, fluorine, and 3 to 40 vol % oxygen, and
        redepositing the polymer in deeper portions of a side wall newly formed by the etching process, wherein:
            a performance of the polymerization process is alternated with a performance of the etching process; and
    c) oxidizing sulfur atoms in an area of a vacuum pump and in an exhaust gas line, wherein the oxidation of the sulfur atoms prevents an interfering deposition of sulfur in the pump and in the exhaust gas line.

2. The method according to claim 1, wherein the structures are defined by an etching mask.

3. The method according to claim 1, wherein the etching gas contains 5 to 25 vol % oxygen during an entire duration of the etching process.

4. The method according to claim 1, wherein the etching gas contains 10 to 15 vol % oxygen during an entire duration of the etching process.

5. The method according to claim 1, wherein the etching gas is used only during intervals of 0.1 to 1 second within the etching process.

6. The method according to claim 1, wherein a media used in the etching process and the polymerization process has gas flow rates of 10 to 200 $cm^3$ [STP]/min and process pressures of 5 to 100 μbar.

7. The method according to claim 1, further comprising the step of generating a plasma with a microwave radiation at powers between 100 and 1500 W.

8. The method according to claim 1, further comprising the step of generating a plasma with a microwave radiation at a power between 100 and 2000 W with an inductive excitation.

9. The method according to claim 1, further comprising the step of applying power to a substrate electrode to accelerate ions to the substrate.

10. The method according to claim 1, wherein the etching gas contains 20 to 40 vol % oxygen during an entire duration of the etching process.

11. The method according to claim 1, wherein the etching gas contains only a compound of sulfur and fluorine and 3 to 40 vol % oxygen.

12. The method according to claim 1, wherein the etching process includes the step of exposing substrates to an ion energy of 1 to 50 eV during an entire duration of the etching process.

13. The method according to claim 12, wherein the ion energy is 5 to 30 eV.

14. The method according to claim 1, wherein the polymerization process includes the step of exposing substrates to an ion energy of 1 to 50 eV.

15. The method according to claim 14, wherein the ion energy is 5 to 30 eV.

16. The method according to claim 14, wherein the ion energy is 15 eV.

17. A method of anisotropic etching of silicon with structures by using a plasma, comprising the steps of:

a) applying a polymer, using a polymerization process and an oxygen-free passivation gas, to a lateral border of the structures;

b) simultaneously:

partially removing the applied polymer using an etching process, the etching process being performed with an etching gas containing sulfur, fluorine, and 3 to 40 vol % oxygen, the oxygen being used only at a beginning of the etching process and redepositing the polymer in deeper portions of a side wall newly formed by the etching process, wherein:
a performance of the polymerization process is alternated with a performance of the etching process; and c) oxidizing sulfur atoms in an area of a vacuum pump and in an exhaust gas line, wherein the oxidation of the sulfur atoms prevents an interfering deposition of sulfur in the pump and in the exhaust gas line.

18. A method of anisotropic etching of silicon with structures by using a plasma, comprising the steps of:

a) applying a polymer, using a polymerization process and an oxygen-free passivation gas, to a lateral border of the structures;

b) simultaneously:

partially removing the applied polymer using an etching process, the etching process being performed with an etching gas containing sulfur, fluorine, and 3 to 40 vol % oxygen, the oxygen being used only at an end of the etching process, and redepositing the polymer in deeper portions of a side wall newly formed by the etching process, wherein:
a performance of the polymerization process is alternated with a performance of the etching process; and c) oxidizing sulfur atoms in an area of a vacuum pump and in an exhaust gas line, wherein the oxidation of the sulfur atoms prevents an interfering deposition of sulfur in the pump and in the exhaust gas line.

\* \* \* \* \*

UNITED STATES PATENT AND TRADEMARK OFFICE
CERTIFICATE OF CORRECTION

PATENT NO. : 6,531,068 B2  Page 1 of 1
DATED : March 11, 2003
INVENTOR(S) : Franz Laermer et al.

It is certified that error appears in the above-identified patent and that said Letters Patent is hereby corrected as shown below:

Column 5,
Line 13, change "$\dot{C}F_2$" to -- $\dot{C}F_2$ --

Signed and Sealed this

Seventeenth Day of August, 2004

JON W. DUDAS
*Acting Director of the United States Patent and Trademark Office*